United States Patent
Tavano et al.

(10) Patent No.: US 11,573,306 B2
(45) Date of Patent: Feb. 7, 2023

(54) SOLID-STATE OPTICAL RECEIVER DRIVER SYSTEM AND METHOD FOR TESTING A SOLID-STATE OPTICAL RECEIVER DRIVER SYSTEM

(71) Applicant: Integrated Device Technology, Inc., San Jose, CA (US)

(72) Inventors: Giuseppe Tavano, Munich (DE); Dominik Gruber, Munich (DE)

(73) Assignee: Integrated Device Technology, Inc., San Jose, CA (US)

(*) Notice: Subject to any disclaimer, the term of this patent is extended or adjusted under 35 U.S.C. 154(b) by 643 days.

(21) Appl. No.: 16/591,997

(22) Filed: Oct. 3, 2019

(65) Prior Publication Data
US 2020/0116839 A1    Apr. 16, 2020

(30) Foreign Application Priority Data

Oct. 15, 2018 (EP) .................................. 18200508
Feb. 7, 2019 (EP) .................................. 19155904

(51) Int. Cl.
*G01S 7/497* (2006.01)
*G01S 17/931* (2020.01)
*G01S 7/4863* (2020.01)

(52) U.S. Cl.
CPC ............ *G01S 7/497* (2013.01); *G01S 7/4863* (2013.01); *G01S 17/931* (2020.01)

(58) Field of Classification Search
CPC ...... G01S 7/497; G01S 7/4863; G01S 17/931; G01S 17/10; G01R 31/007; G01R 31/2635; G01R 31/2829; H01L 27/14601
See application file for complete search history.

(56) References Cited

U.S. PATENT DOCUMENTS

| | | | |
|---|---|---|---|
| 5,585,731 A | 12/1996 | Tsuchida et al. | |
| 6,624,405 B1 | 9/2003 | Lau et al. | |
| 2007/0080696 A1 | 4/2007 | Kumar et al. | |
| 2014/0376855 A1* | 12/2014 | Miller | H04J 14/02 385/14 |

FOREIGN PATENT DOCUMENTS

WO    2017205170 A1    11/2017

OTHER PUBLICATIONS

Liang et al., "Design and Test of an Improved Direct-Injection Readout Circuit for IRFPA," International Symposium on Photoelectronic Detection and Imaging 2007: Photoelectronic Imaging and Detection, edited by Liwei Zhou, Proc. of SPIE, vol. 6621, 662125, 2008, pp. 1-8.

* cited by examiner

*Primary Examiner* — Tony Ko
(74) *Attorney, Agent, or Firm* — Haynes and Boone, LLP

(57) ABSTRACT

Embodiments of the invention relates to a Solid-state optical receiver driver system, particularly for automotive applications, comprising at least one optical receiver channel, the optical receiver channel being connectable to a respective optical receiver, which is characterized in that the solid-state optical receiver driver system further comprises at least one test signal generation unit, for providing a test signal to the at least one optical receiver channel. The invention further relates to a method for testing a solid-state optical receiver driver system.

11 Claims, 3 Drawing Sheets

SOLID-STATE OPTICAL RECEIVER DRIVER SYSTEM AND METHOD FOR TESTING A SOLID-STATE OPTICAL RECEIVER DRIVER SYSTEM

PRIORITY APPLICATIONS

This application claims priority to European Patent Application No. 18200508.2, filed on Oct. 15, 2018, and European Patent Application No. 19155904.6, filed on Feb. 7, 2019.

TECHNICAL FIELD

Embodiments of the present invention are related to spectrometer sensors and, in particular, to a solid state optical receiver driver system and a method for testing a solid-state optical receiver driving system.

DISCUSSION OF RELATED ART

Optical receiver systems are for example used in light detection and ranging (Lidar) systems, also called laser detection and ranging (Ladar) systems. Such systems measure the distance to a target by illuminating the target with pulsed laser light and measuring the reflected pulses with an optical sensor. Differences in laser return times and wavelength can then be used to make 3-D representations of the target. Lidar systems have become popular in automotive applications, for example in advanced safety systems. A lidar systems is for example used to scan the surroundings of a car to detect any obstacles on a collision course with the car and issue a warning to the driver and/or to initiate an emergency brake. Lidar systems are often used in autonomous cars for controlling and navigation purposes. In such automotive applications it is essential that the Lidar systems is highly available and precise with a minimum of detection errors.

The optical receiver system usually comprises a string of optical receivers, which are for example arranged in the front part of an automobile. The string of optical receivers is connected to a solid-state optical receiver driver system, for processing the signals of the optical receivers. For example, the solid-state optical driver receiver system is arranged inside the automobile and connected to the string of optical receivers via a cable. The solid-state optical receiver driver system comprises at least one optical receiver channels, which is connectable to a respective optical receiver. Usually the solid-state optical receiver driver system comprises a separate optical receiver channel for each optical receiver of the optical receiver system.

SUMMARY

Embodiments of the present invention relate to a solid-state optical receiver driver system, particularly for automotive applications. Embodiments of the invention further relate to a method for testing a solid-state optical receiver driver system, particularly for automotive applications.

Since the optical receiver system is important for the overall precision of the Lidar system it is an object of the present invention to provide a solid-state optical receiver driver system which is highly available and precise with a minimum of detection errors.

The object is solved by a solid-state optical receiver driver system, particularly for automotive applications, comprising at least one optical receiver channel, the optical receiver channel being connectable to a respective optical receiver, wherein the solid-state optical receiver driver system further comprises at least one test signal generation unit, for providing a test signal to the at least one optical receiver channel.

Using the internal test signal generation unit, the solid-state optical driver receiver system can provide a test signal to the optical receiver channel of the solid-state optical driver receiver system. The output signal of the optical receiver channel in response to the test signal can be compared to an expected response and thereby validating the functioning of the optical receiver channel. The internal test signal generation unit is easy to implement and provides a reliable testing of the solid-state optical driver receiver system. The testing of the solid-state optical driver receiver system can be performed before installation and/or during use of the solid-state optical driver receiver system. Thereby a highly available and precise solid-state optical driver receiver system can be provided.

In general, the solid-state optical receiver driver system can comprise one or more optical receiver channels. Usually the solid-state optical receiver driver system comprises a separate optical receiver channel for each optical receiver of the optical receiver system.

In a variant of the invention each optical receiver channel of the solid-state optical driver receiver system comprises a separate test signal generation unit. In this way all optical receiver channels of the solid-state optical driver receiver system can be tested in parallel, which is particularly advantageous for a testing during use of the solid-state optical driver receiver system. Alternatively, one test signal generation unit can provide a test signal to several optical receiver channels in parallel or subsequently to minimize interferences between the several optical receiver channels.

Pursuant to a variant of the invention the test signal generation unit generates a rectangular or triangular pulse or a DC current for testing the optical receiver channel of the solid-state optical driver receiver system.

According to some embodiments, the optical receiver channel comprises a multiplexer at the input, multiplexing between the signal of the corresponding optical receiver and the signal of the at least one test signal generation unit. The multiplexer decouples the signals of the optical receiver and the at least one test signal generation unit, which improves the accuracy of the solid-state optical driver receiver system.

In accordance some embodiments, the optical receiver channel comprises a transimpedance amplifier and an analog-to-digital converter. The transimpedance amplifier first converts the current signal of the optical receiver respectively the test signal of the test signal generation unit into a voltage and then amplifies it. The amplified voltage analog signal is converted to a digital signal for further processing by a control unit, wherein the control unit can be internal with the solid-state optical receiver driver system or external.

Pursuant to an advantageous embodiment of the invention the gain of the test signal generation unit matches the gain of the transimpedance amplifier of the optical receiver channel. This further increases the accuracy of the solid-state optical driver receiver system.

In a particularly preferred embodiment the transimpedance amplifier of the optical receiver channel comprises a feedback resistor and wherein the test signal generation unit comprises a replica of this feedback resistor for gain matching the amplifier and the test signal generation unit. In this way it is possible to match any gain change of the amplifier as well as cancelling out process variations due to the resistor itself.

According to an embodiment of the invention the test signal generation unit comprises a current based digital-to-analog converter and a current generation unit. The current generation unit provides a current with a wanted current amplitude. This current can be provided directly to the optical receiver channel of the solid-state optical driver receiver system or the current can be pulsed to create a rectangular pulse or integrated by a capacitor to create a triangular shape.

In accordance with a further embodiments of the invention the test signal generation unit comprises an output for providing the test signal of the test signal generation unit to an external unit, like e.g. a control unit. Thereby the control unit has knowledge of the generated test signal and can compare the result of the optical receiver channel of the solid-state optical driver receiver system with the expected result based on the generated test signal.

The object is further solved by a method for testing a solid-state optical driver receiver system, particularly for automotive applications, comprising the steps of: generating a test signal within the solid-state optical driver receiver system, applying the generated test signal to at least one optical receiver channel of the solid-state optical driver receiver system, monitoring the output of the at least one optical receiver channel in response to the applied test signal, and comparing the output of the at least one optical receiver channel to an expected output of the at least one optical receiver channel.

The test signal is for example generated by a test signal generation unit of the solid-state optical driver receiver system. The output of the at least one optical receiver channel is compared to the expected output of the at least one optical receiver channel by e.g. a control unit, internal or external to the solid-state optical driver receiver system. The expected output of the at least one optical receiver channel bases on the applied test signal.

According to an embodiment of the invention a separate test signal is generated for each optical receiver channel of the solid-state optical driver receiver system. Thus, different test signals can be applied to different optical receiver channels.

Pursuant to an embodiment of the invention the steps of generating, applying, monitoring and comparing are executed for each optical receiver channel of the solid-state optical driver receiver system in parallel. Thus, all optical receiver channels are tested at the same time.

In some embodiments of the invention the steps of generating, applying, monitoring and comparing are repeated sequentially for each optical receiver channel of the solid-state optical driver receiver system.

In accordance with some embodiments of the invention the method for testing the solid-state optical driver receiver system comprises the step of multiplexing between the test signal and a signal of an optical receiver. In this way, the testing can take place during use of the solid-state optical driver receiver system and at the same time the test signal and the signal of the optical receiver are decoupled, whereby the accuracy of the method is increased.

According to some embodiments of the invention the at least one optical receiver channel amplifies the input signal and converts the analog input signal to a digital output signal. The digital output signal is for example processed by a control unit, i.e. by comparing the received output signal with an expected outcome signal based on the applied test signal.

Pursuant to some embodiments of the invention the method for testing the solid-state optical driver receiver system comprises the step of matching the gain of a test signal generation unit to the gain of a transimpedance amplifier of the at least one optical receiver channel. This gain matching increases the accuracy of the inventive method.

In some embodiments of the invention the method of testing the solid-state optical driver receiver system comprises the step of providing the test signal to an external unit, like for example a control unit. The external unit can compare the test signal with the output of the optical receiver channel of the solid-state optical driver receiver system and determine if the system is functioning properly.

Preferably the method is executed before installation and/or during use of the solid-state optical driver receiver system. Thus, the functioning of the solid-state optical driver receiver system is tested before installation and can further be tested during the whole lifecycle of the solid-state optical driver receiver system, providing a highly available system, particularly for automotive applications.

Pursuant to some embodiments of the invention the method for testing the solid-state optical driver receiver system is executed periodically, preferably at times where no optical input is expected. Usually a Lidar system or similar system periodically sends out light signal and afterwards detects and processes the received, i.e. reflected, light signals. At times where no light signal is sent out respectively no reflected light signal is expected; the test signal can be applied to the optical receiver channels of the solid-state optical driver receiver system.

According to some embodiments of the invention the optical receivers providing an input signal to the optical receiver channels of the solid-state optical driver receiver system are disabled during execution of the method for testing the solid-state optical driver receiver system. In this way no signal of the optical receivers is forwarded to the optical receiver channels, which minimized any interference with the test signal applied to the optical receiver channels.

In the following embodiments of the invention will be further explained with respect to the embodiments shown in the figures. It shows:

DETAILED DESCRIPTION

Figure 1:
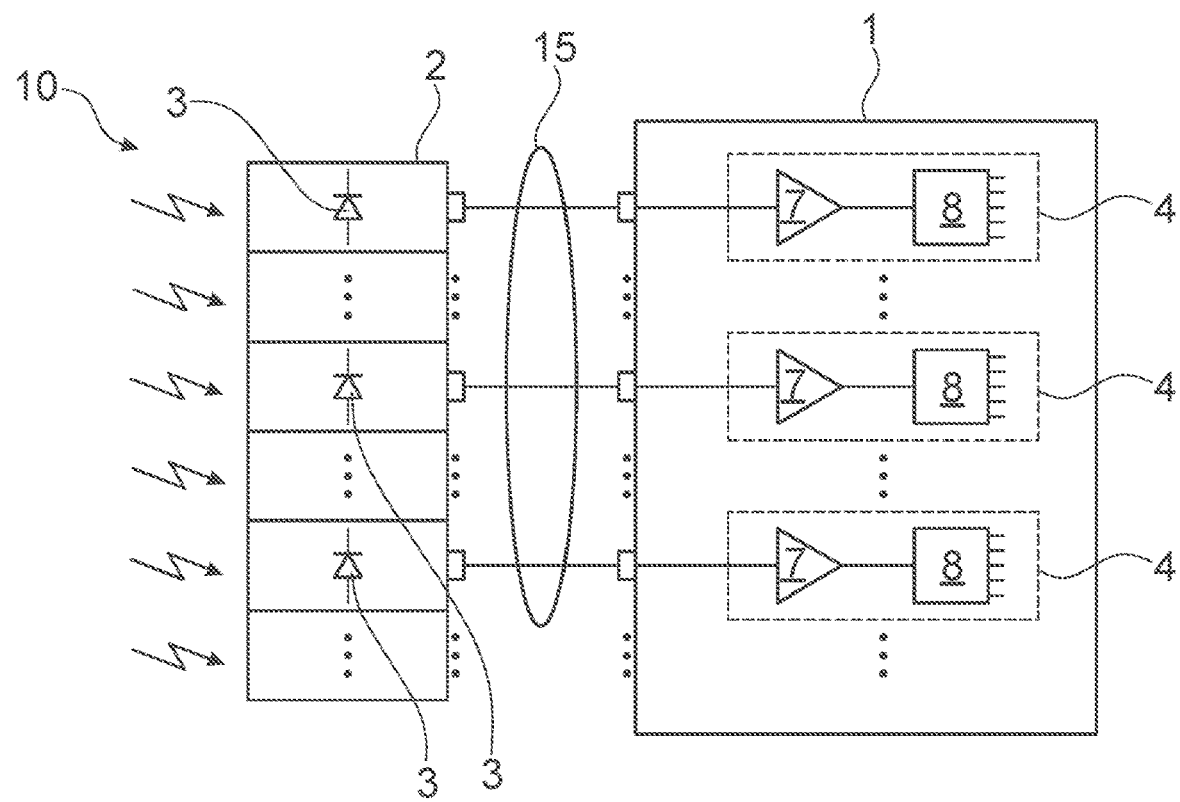
FIG. 1 a block diagram of an optical receiver system according to the prior art, FIG. 2 a block diagram of an optical receiver system comprising a solid-state optical receiver driver system according to a first embodiment of the invention, FIG. 3 a block diagram of a solid-state optical receiver driver system according to a second embodiment of the invention for an optical receiver system, FIG. 4 a block diagram of a solid-state optical receiver driver system according to a third embodiment of the invention for an optical receiver system, and FIG. 5 a block diagram of a solid-state optical receiver driver system according to a fourth embodiment of the invention for an optical receiver system.

FIG. 1 shows a block diagram of an optical receiver system 10 according to the prior art. Such an optical receiver system 10 is for example used in light detection and ranging (Lidar) systems, also called laser detection and ranging (Ladar) systems.

Light detection and ranging systems measure the distance to a target by illuminating the target with pulsed laser light and measuring the reflected pulses with the optical receiver system 10. Differences in laser return times and wavelength can then be used to make 3-D representations of the target. Recently such light detection and ranging systems have been used in autonomous vehicles, for detecting any obstacles in the surroundings of the vehicle. In such applications the accuracy and availability of the light detection and ranging system is essential.

Alight detection and ranging system usually comprises at least one light source for emitting light to the surroundings of the light detection and ranging system and an optical receiver system 10 for detecting any light signal reflected and/or backscattered from a target in the surroundings of the light detection and ranging system.

FIG. 1 shows a block diagram of an optical receiver system 10 according to the prior art for a light detection and ranging system. The optical receiver system 10 comprises a string 2 of optical receivers 3. This string 2 of optical receivers 3 is usually arranged in the front part of a vehicle. The optical receivers 3 receive the light signal reflected and/or backscattered from the target in the surroundings of the light detection and ranging system and convert these light signals into analog electrical signals.

The optical receiver system 10 further comprises a solid-state optical receiver driver system 1 for receiving and processing the analog electrical signals of the string 2 of optical receivers 3. Advantageously the solid-state optical receiver driver system 1 is not located at the front part of the vehicle, but at a more remote location, due to the environmental stresses occurring in the front part of the vehicle. Therefore, the string 2 of optical receivers 3 is connected to the solid-state optical receiver driver system 1 by a cable 15.

The solid-state optical receiver driver system 1 comprises a separate optical receiver channel 4 for each optical receiver 3 of the string of optical receivers 3. The separate optical receiver channels 4 are indicated by a dashed line in FIG. 1. Each optical receiver channel 4 is connected to one optical receiver 3 of the string 2 of optical receivers 3 by cable 15.

Each optical receiver channel 4 for example comprises a transimpedance amplifier 7 for converting and amplifying the analog electrical signal of the optical receiver 3 and an analog-to-digital converter 8 for converting the amplified analog electrical signal of the optical receiver 3 to a digital signal.

The digital signal can be further processed by an internal control unit (not shown) of the solid-state optical receiver driver system 1 or transmitted to an external control unit (not shown). Differences in the received laser return times and wavelength are used to calculate a 3-D representation of a target in the surroundings of the light detection and ranging system.

Figure 2:
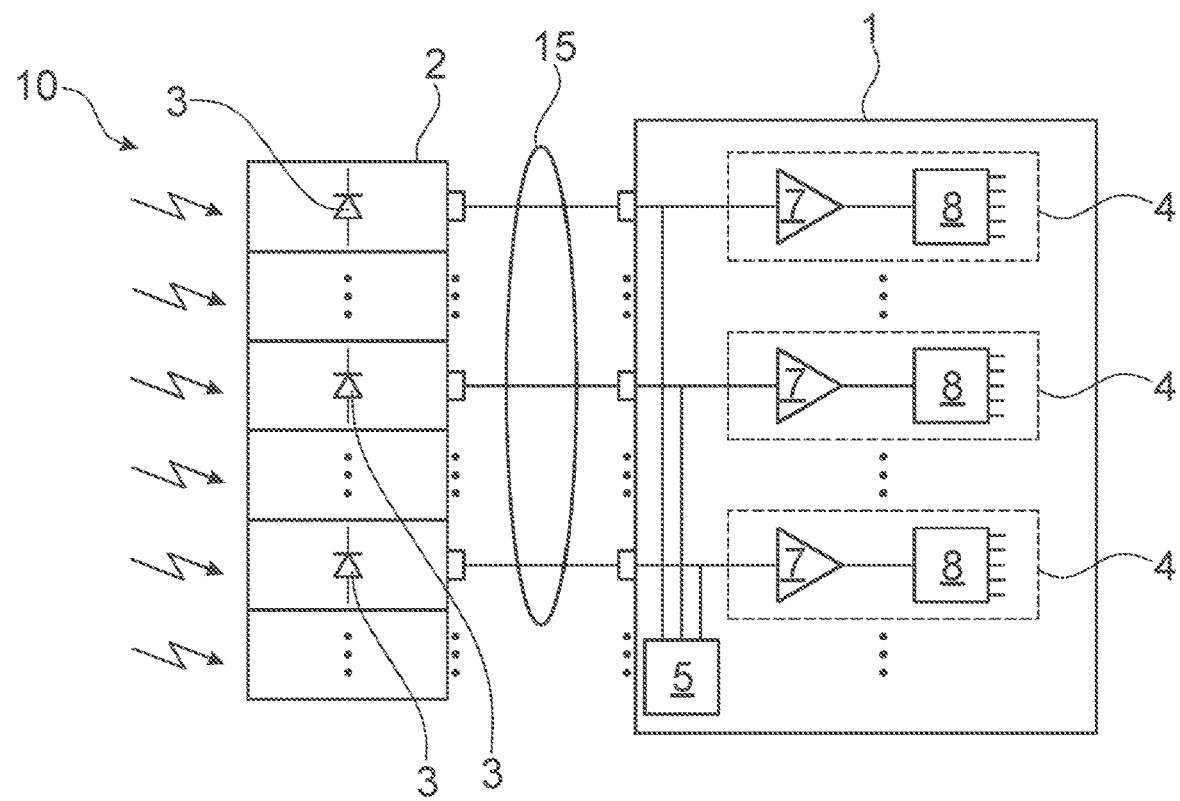

FIG. 2 shows a block diagram of an optical receiver system 10 comprising a solid-state optical receiver driver system 1 according to a first embodiment of the invention. The optical receiver 10 shown in FIG. 2 differs from the optical receiver system 10 shown in FIG. 1 in that the solid-state optical receiver driver system 1 further comprises a test signal generation unit 5, for providing a test signal to the optical receiver channels 4. The test signal can be for example a rectangular or triangular pulse or a DC current.

The test signal generation unit 5 generates a test signal within the solid-state optical receiver driver system 1. This test signal is applied to the optical receiver channels 4 of the solid-state optical receiver driver system 1. The test signal can be either applied to all optical receiver channels 4 at the same time or subsequently one after the other. The output of the optical receiver channels 4 in response to the applied test signal is monitored and compared to an expected output of the optical receiver channel 4 based on the applied test signal. This comparison can be performed by an internal or external control unit.

Figure 3:
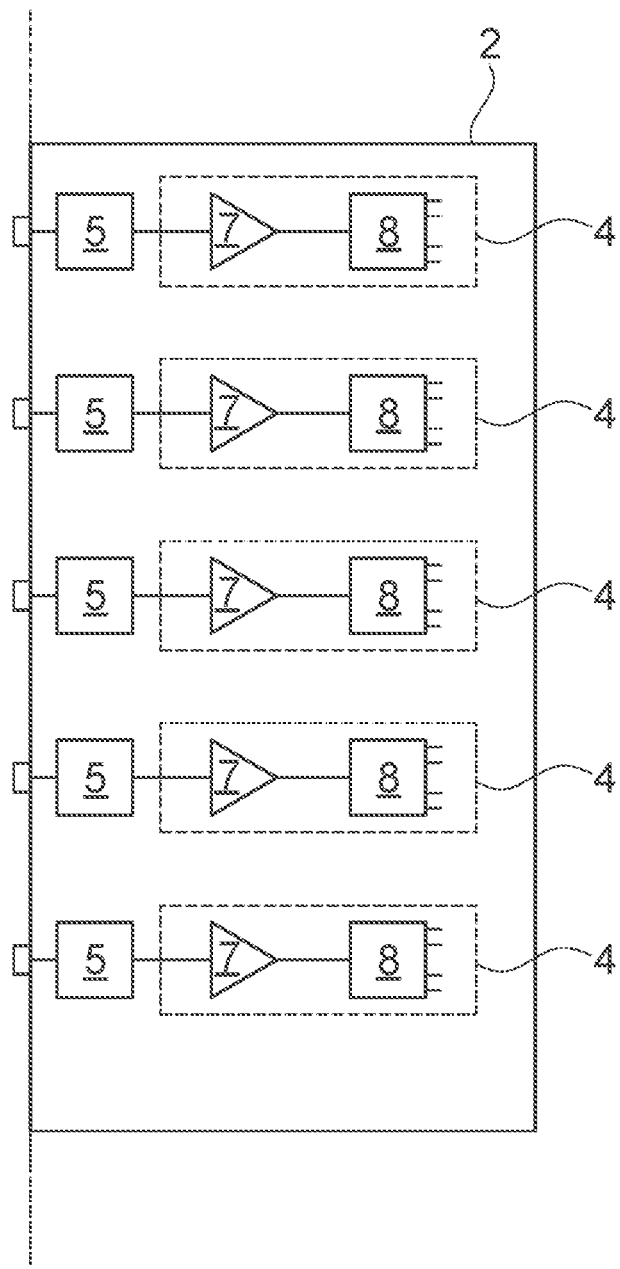

In FIG. 3 a second embodiment of a solid-state optical receiver driver system 1 according to the invention is shown. The second embodiment shown in FIG. 3 differs from the first embodiment shown in FIG. 2 in that the solid-state optical receiver driver system 1 comprises a separate test signal generation unit 5 for each optical receiver channel 4. Thus, the optical receiver channels 4 are completely decoupled from one another, thereby reducing interferences and increasing the accuracy of the solid-state optical receiver driver system 1.

Using a separate test signal generation unit 5 for each optical receiver channel 4 a test signal can be applied to each optical receiver channel 4 at the same time, without creating any interferences.

Figure 4:
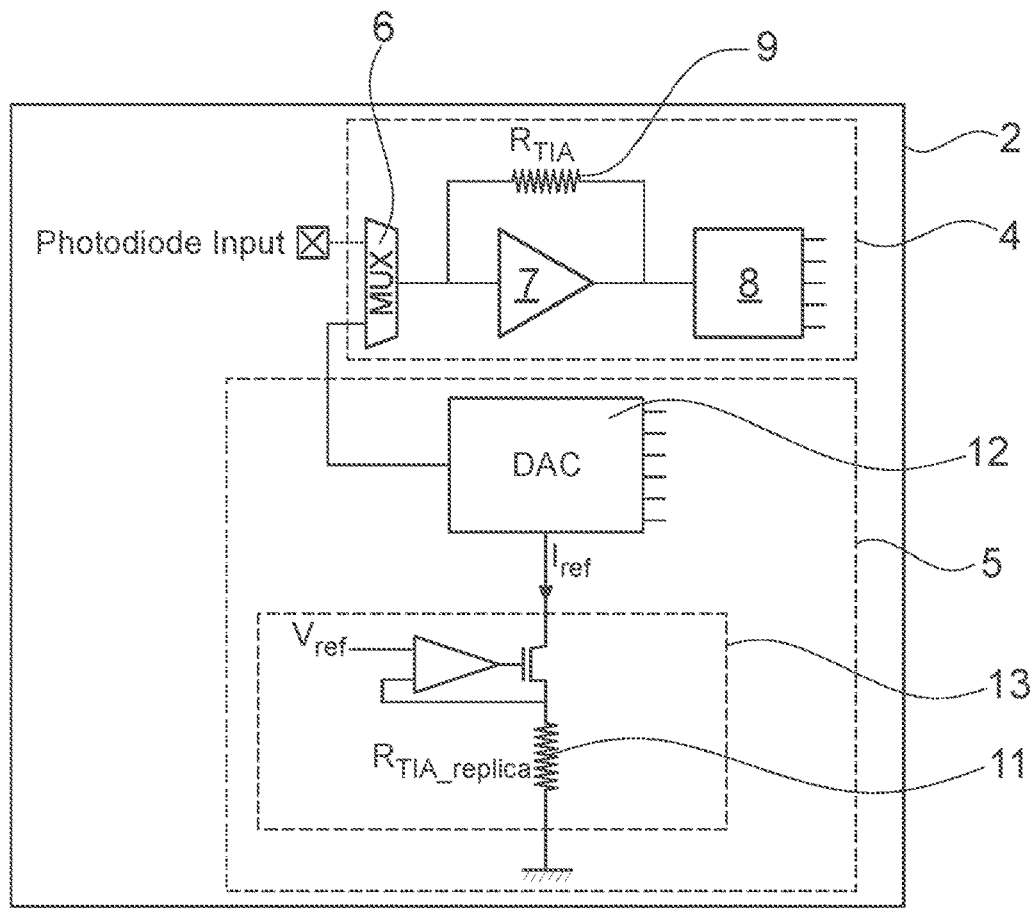

FIG. 4 shows a third embodiment of a solid-state optical receiver driver system 1. In FIG. 4 only one optical receiver channel 4 with a corresponding test signal generation unit 5 is shown, but the solid-state optical receiver driver system 1 can comprise more optical receiver channels 4 and associated test signal generation units 5, as for example shown in FIG. 3.

The optical receiver channel 4 of the solid-state optical receiver driver system 1 shown in FIG. 4 comprises a multiplexer 6 at the input, multiplexing between the signal of the corresponding optical receiver 3 ant the test signal of the test signal generation unit 5. The multiplexer decouples the test signal from the signal of the optical receiver 3, thereby reducing interferences between these signals and increasing the accuracy of the solid-state optical receiver driver system 1.

Furthermore, according to the third embodiment of FIG. 4 the transimpedance amplifier 7 of the optical receiver channel 4 comprises a feedback resistor 9.

The third embodiment of FIG. 4 of the solid-state optical receiver driver system 1 further shows more details with respect to the test signal generation unit 5. The test signal generation unit 5 comprises for example a digital-to-analog converter 12 and a current generator 13.

Advantageously the gain of the test signal generation unit 5 matches the gain of the transimpedance amplifier 7 of the optical receiver channel 4. This is for example achieved by a resistor 11 of the current generation unit 13, which is a replica of the feedback resistor 9 of the amplifier 7 of the optical receiver channel 4.

The current generation unit 13 provides a current with a defined amplitude, preferably for gain matching the amplifier 7 of the optical receiver channel 4. This current is provided to the digital-to-analog converter 12, which can simply forward this generated current to the multiplexer 6 of the optical receiver channel 4 as it is or scale it according the digital input code. Alternatively, the digital-to-analog converter can pulse the current of the current generation unit 13 to provide a rectangular pulse to the multiplexer 6 of the optical receiver channel 4 or the digital-to-analog converter can integrate the current provided by the current generation unit 13 over a capacitor to provide a triangular pulse to the multiplexer 6 of the optical receiver channel 4. Thus, preferably the digital-to-analog converter 12 is current based.

Figure 5:
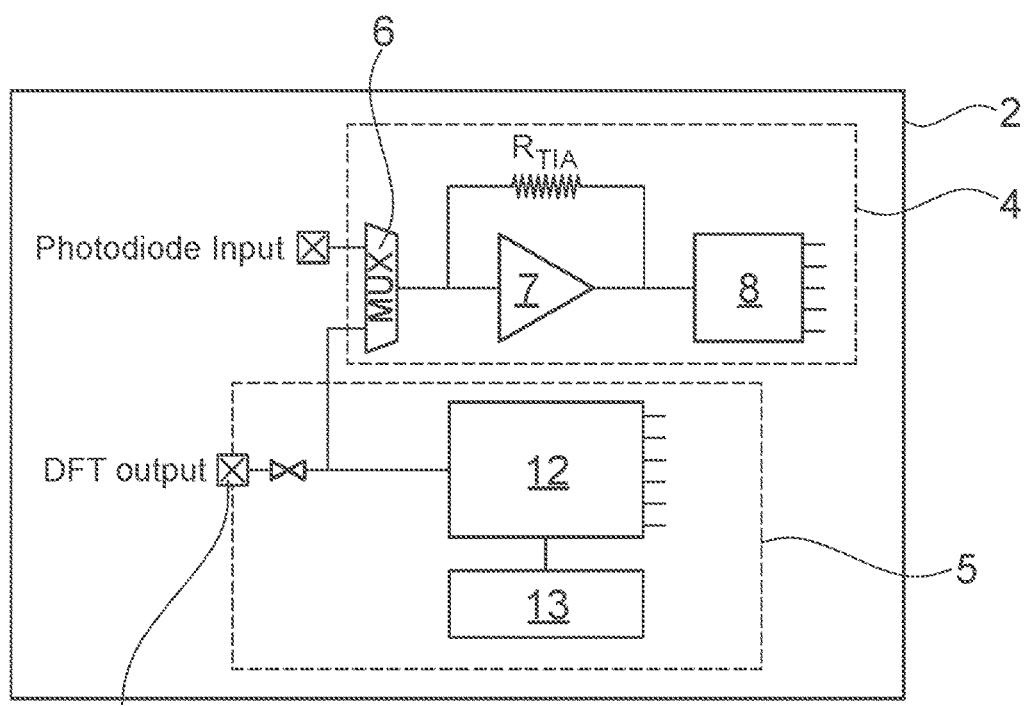

In FIG. 5 a fourth embodiment of a solid-state optical receiver driver system 1 according to the invention is shown. The details of the current generation unit 13 of the test signal generation unit 5 have been masked by a black-box in comparison to the third embodiment of the invention shown in FIG. 4.

Mainly the fourth embodiment shown in FIG. 5 differs from the third embodiment shown in FIG. 4 in that the test signal generation unit 5 further comprises an output 14 for the generated test signal. The output 14 can provide the generated test signal to an external unit, for example to compare the test signal with the results of the processing of the test signal by the optical receiver channel 4.

1 solid-state optical receiver driver system 1
2 string of optical receivers
3 optical receiver
4 optical receiver channel
5 test signal generation unit
6 multiplexer
7 amplifier
8 analog-to-digital converter
9 feedback resistor
10 optical receiver system
11 replica of feedback resistor
12 digital-to-analog converter
13 current generation unit
14 test signal output
15 cable

What is claimed is:

1. A solid-state optical receiver driver system, comprising:
at least one optical receiver channel, the optical receiver channel being connectable to a respective optical receiver; and
at least one test signal generator unit that provides a test signal to the at least one optical receiver channel,
wherein the optical receiver channel comprises a transimpedance amplifier and an analog-to-digital converter, and
wherein the gain of the test signal generation unit matches the gain of the transimpedance amplifier of the optical receiver channel.

2. The solid-state optical receiver driver system according to claim 1,
wherein each optical receiver channel comprises a separate test signal generation unit.

3. The solid-state optical receiver driver system according to claim 1, wherein the optical receiver channel comprises a multiplexer at the input, multiplexing between the signal of the corresponding optical receiver and the signal of the at least one test signal generation unit.

4. The solid-state optical receiver driver system according to claim 1, wherein the transimpedance amplifier of the optical receiver channel comprises a feedback resistor and wherein the test signal generation unit comprises a replica of this feedback resistor for gain matching the amplifier and the test signal generation unit.

5. The solid-state optical receiver driver system according to claim 1,
wherein the test signal generation unit further comprises an output for providing the test signal of the test signal generation unit to an external unit.

6. A solid-state optical receiver driver system, comprising:
at least one optical receiver channel, the optical receiver channel being connectable to a respective optical receiver; and
at least one test signal generator unit that provides a test signal to the at least one optical receiver channel,
wherein the test signal generation unit comprises a current based digital-to-analog converter and a current generation unit.

7. A method for testing a solid-state optical receiver driver system, comprising:
generating a test signal within the solid-state optical receiver driver system;
applying the generated test signal to at least one optical receiver channel of the solid-state optical receiver driver system;
monitoring the output of the at least one optical receiver channel in response to the applied test signal; and
comparing the output of the at least one optical receiver channel to an expected output of the at least one optical receiver channel,
wherein the at least one optical receiver channel amplifies the input signal and converts the analog input signal to a digital output signal, and
further comprising matching the gain of a test signal generation unit to the gain of an amplifier of the at least one optical receiver channel.

8. The method for testing a solid-state optical receiver driver system according to claim 7, wherein a separate test signal is generated for each optical receiver channel of the solid-state optical receiver driver system.

9. The method for testing a solid-state optical receiver driver system according to claim 7, wherein the steps of generating, applying, monitoring and comparing are executed for each optical receiver channel of the solid-state optical receiver driver system in parallel.

10. The method for testing a solid-state optical receiver driver system according to claim 7, further comprising multiplexing between the test signal and a signal of an optical receiver.

11. The method for testing a solid-state optical receiver driver system according claim 7, further comprising providing the test signal to an external unit.

* * * * *